United States Patent
Oshima et al.

(10) Patent No.: US 6,877,118 B2
(45) Date of Patent: Apr. 5, 2005

(54) MEMORY TESTING METHOD AND MEMORY TESTING APPARATUS

(75) Inventors: Hiromi Oshima, Tokyo (JP); Noboru Okino, Tokyo (JP); Yasuhiro Kawata, Tokyo (JP)

(73) Assignee: Advantest Corporation, Tokyo (JP)

( * ) Notice: Subject to any disclaimer, the term of this patent is extended or adjusted under 35 U.S.C. 154(b) by 439 days.

(21) Appl. No.: 09/844,301

(22) Filed: Apr. 27, 2001

(65) Prior Publication Data

US 2001/0052093 A1 Dec. 13, 2001

(30) Foreign Application Priority Data

May 2, 2000 (JP) ........................................ 2000-133432

(51) Int. Cl.[7] .............................................. G11C 29/00
(52) U.S. Cl. ........................ 714/719; 714/718; 365/201
(58) Field of Search ................................ 714/718, 719, 714/710, 704, 736; 365/201, 200

(56) References Cited

U.S. PATENT DOCUMENTS

| | | | |
|---|---|---|---|
| 5,271,015 A | | 12/1993 | Akiyama |
| 5,539,699 A | | 7/1996 | Sato |
| 5,717,694 A | * | 2/1998 | Ohsawa |
| 5,956,350 A | * | 9/1999 | Irrinki et al. |
| 5,978,949 A | * | 11/1999 | Terayama |
| 5,983,374 A | | 11/1999 | Todome et al. |
| 6,009,028 A | * | 12/1999 | Akiyama |
| 6,499,119 B1 | * | 12/2002 | Orita et al. |
| 6,601,198 B1 | * | 7/2003 | Goko |

FOREIGN PATENT DOCUMENTS

| | | |
|---|---|---|
| JP | 07073700 | 3/1995 |
| JP | 10125092 | 5/1998 |

* cited by examiner

*Primary Examiner*—Phung My Chung
(74) *Attorney, Agent, or Firm*—David N. Lathrop, Esq.; Gallagher & Lathrop (57) ABSTRACT

A memory testing method and apparatus are provided, which can test in short time a flash memory. In case of testing a flash memory having block function, in a memory testing method and apparatus in which a predetermined logical value is written in memory cells constituting each of blocks of the memory, the written logical value is read out from the memory cells to compare it with an expected value, and a decision that, when the read-out logical value and the expected value do not coincide with each other, such memory cell is a failure memory cell, a decision is rendered that, when the number of failure memory cells in each block reaches a predetermined number, such block is a bad block, and the test of such block is stopped. In addition, a decision is rendered that, when the number of failure memory cells on the same address line reaches a predetermined number, such address line is a bad address line, and after such decision has rendered, the test of memory cells on the bad address line is substantially not effected.

9 Claims, 6 Drawing Sheets

MEMORY TESTING METHOD AND MEMORY TESTING APPARATUS

BACKGROUND OF THE INVENTION

1. Field of the Invention

The present invention relates to a memory testing method and a memory testing apparatus for testing a memory having block function called, for example, a flash memory that the stored data therein can be electrically erased in all bits en bloc or in block by block en bloc and new data can be rewritten therein.

2. Description of the Related Art

Figure 4:
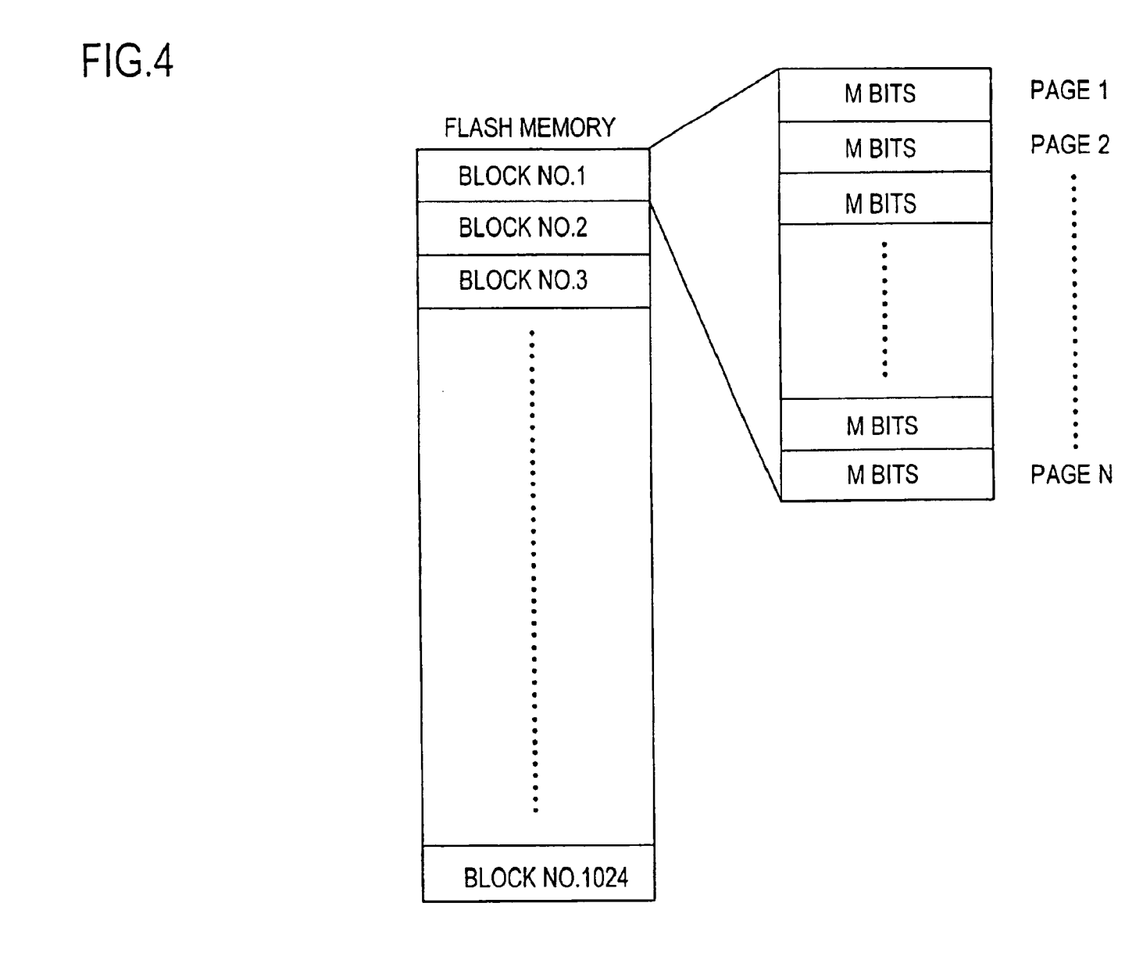
FIG. 4 is a structural diagram for explaining an example of the structure of a flash memory to be tested by the memory testing apparatus according to the present invention.

Among PROMs (programmable read only memories) which are rewritable read only memories is called "flash memory" in this technical field a memory the stored contents of which are replaceable by electrically erasing the stored contents in all bits en bloc or in block by block en bloc and rewriting data therein. As shown in FIG. 4, such flash memory has its internal structure separated into a plurality of blocks (in this example, 1024 blocks from block No. 1 to block No. 1024). Each of the blocks is constituted by N pages (N is an integer equal to or greater than 2), and each of the N pages is constituted by M bits (M is an integer equal to or greater than 2). The flash memory has block function by which the stored contents thereof can be electrically erased not only in all bits en bloc but also in block by block en bloc, and therefore, the stored contents thereof can be replaced by rewriting new data in one or more blocks or in all blocks from which the stored contents have been erased. In general, there are many cases that each block comprises 16 pages (N=16) and each page comprises 512 bits (M=512) to 2048 bits (M=2048).

Figure 5:
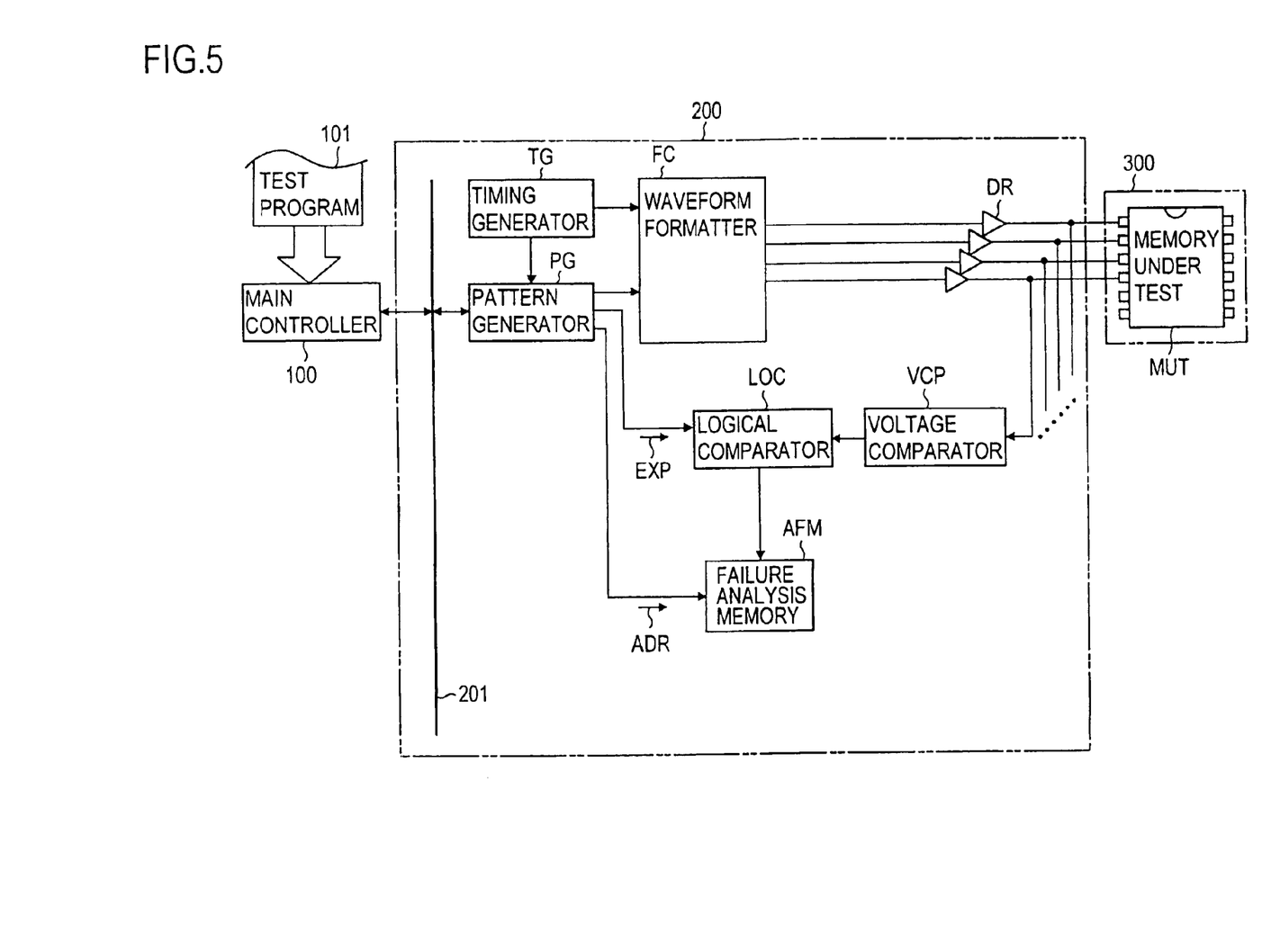
FIG. 5 is a block diagram showing an example of the prior memory testing apparatus.

Conventionally, such flash memory is tested and measured by a memory testing apparatus adapted for testing and measuring commonplace memories (for example, IC memories constituted by semiconductor integrated circuits). FIG. 5 shows, in block diagram, a general construction of the typical memory testing apparatus that has been heretofore used.

The illustrated memory testing apparatus comprises a main controller 100, a testing apparatus proper 200 called "main frame" in this technical field (the testing apparatus proper 200 being referred to as main frame, hereinafter) and a test head 300 separately constructed from the main frame 200. The main frame 200 comprises, in this example, a timing generator TG, a pattern generator PG, a waveform formatter FC, drivers DR, a voltage comparator VCP, a logical comparator LOC, and a failure analysis memory AFM.

The test head 300 constructed separately from the main frame 200 usually has a predetermined number of device sockets (not shown) mounted on the top portion of the test head 300. In addition, printed boards each called "pin card" in this technical field are accommodated within the test head 300, and each pin card usually has a circuit containing one driver DR and one voltage comparator VCP of the main frame 200 formed thereon.

In general, the test head 300 is mounted to a test section of a semiconductor device transporting and handling apparatus called "handler" in this technical field, and the test head 300 is electrically connected to the main frame 200 by signal transmission means such as cables, optical fibers or the like.

A memory to be tested (a memory under test) MUT is mounted on a device socket of the test head 300, through which a test pattern signal is written in the memory under test MUT from the main frame 200 and a response signal read out of the memory under test MUT is supplied to the main frame 200, thereby to perform the test and the measurement for the memory under test MUT.

Further, in FIG. 5 only the drivers DR are shown in the plural form (four in this example), but, in reality, there are provided a predetermined number (which is, for example equal to the number of input/output pins of the memory under test MUT) of drivers DR (if the number of input/output pins of the memory under test MUT is, for example, 512, then 512 drivers DR are provided). In addition, in FIG. 5, in order to simplify the drawing, each of the components in the main frame 200 except the drivers DR (the timing generator TG, the pattern generator PG, the waveform formatter FC, the voltage comparator VCP, and the logical comparator LOC) is shown as one block, but in practice the remaining components in the main frame 200 except the timing generator TG and the failure analysis memory AFM are also provided by the same number (for example, 512) as that of the drivers DR, respectively. It is needless to say that the construction of the main frame is not limited to such construction as mentioned above.

The main controller 100 is constituted by a computer system having its scale of, for example, a workstation or so, and a test program 101 created by a user (programmer) is previously stored therein, and it controls the entire memory testing apparatus in accordance with the test program 101. The main controller 100 is connected to the timing generator TG, the pattern generator PG, and the like in the main frame 200 via a tester bus 201, and transfers test conditions described in the test program 101 to the pattern generator PG and the timing generator TG to initialize them. The main controller 100 controls the pattern generator PG and the timing generator TG in accordance with the initialized conditions to carry out a testing for the memory under test MUT.

When a control instruction or command is given to the pattern generator PG from the main controller 100, the pattern generator PG outputs test pattern data to be applied to the memory under test MUT in accordance with the initialized condition (for example, pattern generating sequence) stored therein.

The timing generator TG outputs, when a control instruction or command is given thereto from the main controller 100, various kinds of timing clocks (timing pulses) for each test period in accordance with the initialized condition (for example, various kinds of timing data outputted for every test period) stored therein.

The waveform formatter FC defines a rise timing and a fall timing of a signal waveform on the basis of the test pattern data outputted from the pattern generator PG and the timing pulses outputted from the timing generator TG, to produce a test pattern signal having a real waveform that changes from/to logical H (logical "1") to/from logical L (logical "0").

Each of the drivers DR defines the amplitude of the test pattern signal outputted from the waveform formatter FC to a desired amplitude (logical H, i.e., voltage of logical "1" or logical L, i.e., voltage of logical "0") and applies such test pattern signal to the device socket of the test head 300, thereby to drive the memory under test MUT.

The voltage comparator VCP determines whether a logical value of a response signal outputted from the memory under test MUT has a normal voltage value or not. That is, the voltage comparator VCP determines whether or not a voltage of logical H has a value equal to or greater than the defined voltage value in case the response signal is of logical H and whether or not a voltage of logical L has a value equal to or less than the defined voltage value in case the response signal is of logical L.

In case the determination result of the voltage comparator VCP indicates a good result (pass), the output signal of the voltage comparator VCP is inputted to the logical comparator LOC where it is compared with an expected value pattern data (signal) EXP supplied from the pattern generator PG, thereby to determine whether or not the memory under test MUT has outputted a normal response signal. The comparison result of the logical comparator LOC is stored in the failure analysis memory AFM.

When the output signal of the voltage comparator VCP does not coincide with the expected value pattern data, the logical comparator LOC determines a memory cell of the memory under test MUT at the address thereof from which the response signal has been read out to be defective or failure, and generates a failure signal indicating that fact. Usually, when the failure signal is generated, a logical "1" signal being always applied to a data input terminal of the failure analysis memory AFM is enabled to be written in the failure analysis memory AFM, and the logical "1" data is written as a failure data in a memory cell of the failure analysis memory AFM specified by an address signal ADR supplied from the pattern generator PG. In general, a failure data (logical value "1") is stored in the same address of the failure analysis memory AFM as that of the failure memory cell of the memory under test MUT.

On the contrary, when the response signal from the memory under test coincides with the expected value pattern data EXP, the logical comparator LOC determines a memory cell of the memory under test MUT at the address thereof from which the response signal has been read out to be normal, and generates a pass signal indicating that fact. Usually, the pass signal is not stored in the failure analysis memory AFM.

After the test has been completed, a failure analysis of the memory under test MUT is carried out with reference to the failure data stored in the failure analysis memory AFM. For example, in case the failure data are utilized for repair or relief of the failure memory cells, a failure map will be created based on the read-out failure data whereby a decision will be rendered as to whether the repair or relief of the failure memory cells of the memory under test MUT can be carried out or not.

As is well known, the failure analysis memory AFM is constructed by a memory having its storage capacity equal to or more than that of the memory under test MUT so that the data representing the failure/pass determination results of all the bits of the memory under test MUT can be stored therein.

Accordingly, even in case of testing a flash memory, heretofore, the data representing the failure/pass determination results of all the bits of the flash memory are also stored in the failure analysis memory AFM. After the test has been completed, the stored data are utilized, for example, in case of carrying out a failure repair analysis in which a decision is rendered whether the repair of the failure memory cells is possible or not by supplying an address signal to the failure analysis memory AFM to discriminate each of the blocks of the flash memory, and then counting the number of failure memory cells for each block.

Figure 6:
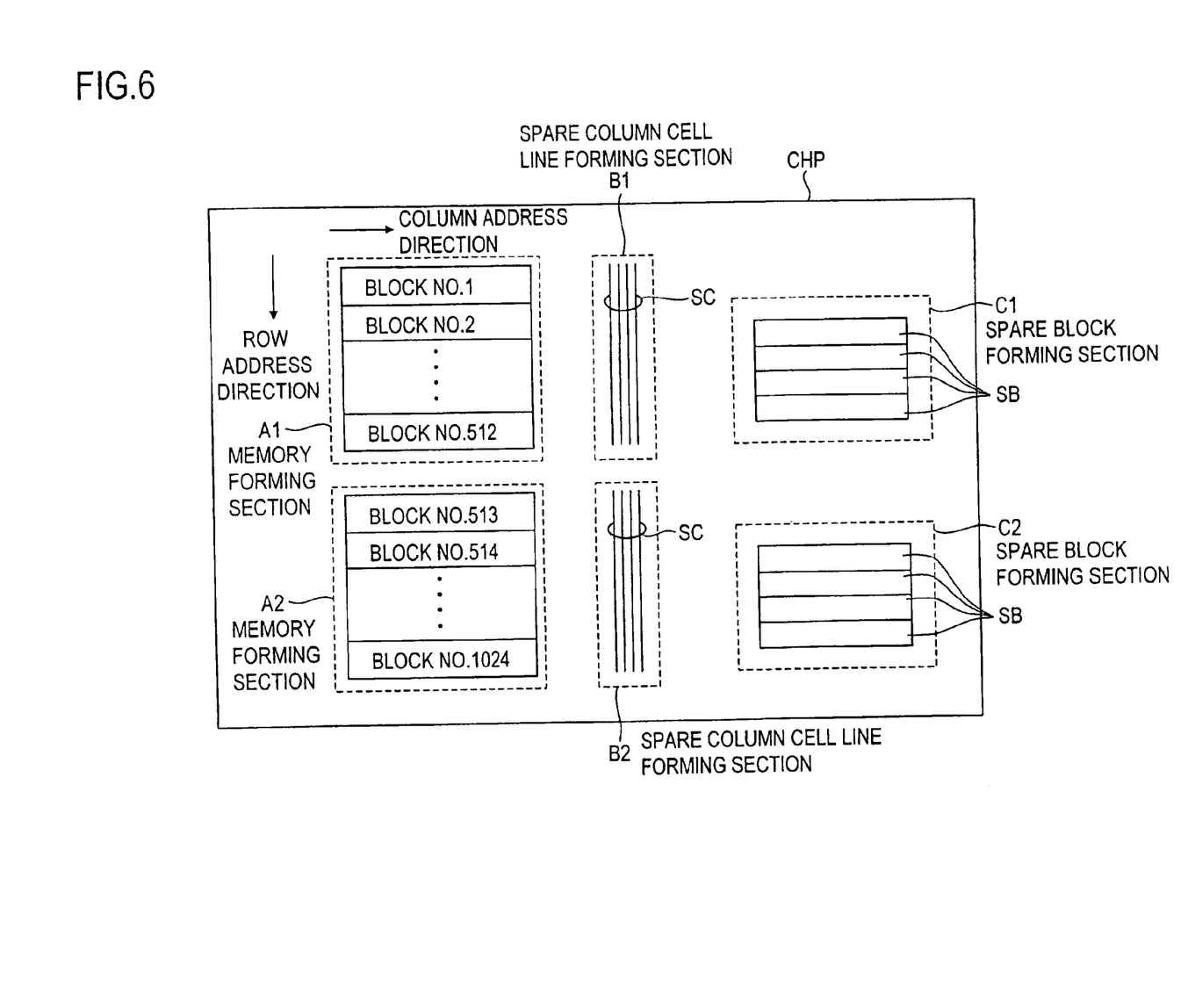
FIG. 6 is a structural diagram for explaining an example of the failure repair structure of a semiconductor chip constituting a general flash memory.

FIG. 6 is a structural diagram for explaining a failure repair structure of the semiconductor chip forming a general flash memory. In the semiconductor chip CHP are provided a first and a second two memory forming sections A1 and A2 for forming a flash memory therein, a first and a second two spare column cell line forming sections B1 and B2 for forming therein a spare memory cell line or lines in the column direction (up-and-down direction on the figure, which is the same direction as that of the row address direction) respectively, and a first and a second two spare block forming sections C1 and C2 for forming a spare block or blocks therein respectively. Here, "cell line" is equivalent to "memory cell line" and means a series of memory cells arranged in a line in the row direction (up-and-down direction) or in the column direction (left and right direction).

In the illustrated example, block No. 1 to block No. 512 of the flash memory are formed in the first memory forming section A1 and block No. 513 to block No. 1024 of the flash memory are formed in the second memory forming section A2. Further, there is shown in FIG. 6 a case that the two memory forming sections A1 and A2 are provided in the semiconductor chip CHP. However, this case is merely one example of the failure repair structure of the semiconductor chip forming a general flash memory, and hence the number of the memory forming sections provided in the semiconductor chip CHP can be arbitrarily selected. The number of the spare column cell line forming sections and the number of the spare block forming sections will be increased or decreased in correspondence to increase or decrease of the number of the memory forming sections.

In the first spare column cell line forming section B1 are formed a predetermined number of spare column cell lines SC for repairing one or more failure memory cells on the column address lines in the first memory forming section A1. In this example, a case is shown that four spare column cell lines SC are formed in the first spare column cell line forming section B1. In the second spare column cell line forming section B2 are formed a predetermined number of spare column cell lines SC for repairing one or more failure memory cells on the column address lines in the second memory forming section A2. These spare column cell lines SC are provided for substituting oneself, in case that one or more failure memory cells have been detected on at least one specified column address line formed in the corresponding first or second memory forming section A1 or A2, for the memory cell line or lines including such failure memory cell or cells on the specified column address line or lines. By this substitution, the memory cell line or lines including at least one failure memory cell on the specified column address line or lines are repaired or relieved, the flash memory including one or more failure memory cells, that is, the defective flash memory can be changed to a good or pass article.

In the first and second spare block forming sections C1 and C2 are formed respectively a plurality of (four in this example) spare blocks SB. The plurality of spare blocks SB are provided for substituting oneself, in case that one or more failure blocks have been detected in the corresponding first or second memory forming section A1 or A2, for such failure block or blocks. By this substitution, the failure block or blocks can be repaired or relieved, the flash memory including one or more failure blocks, that is, the defective flash memory can be changed to a good or pass article.

A test for a flash memory is performed on the basis of one block by one block. For example, the block No. 1 which is the first block of the flash memory is accessed by the corresponding row address, and then the memory cells in the accessed block No. 1 are sequentially accessed in the column address direction (left and right direction on the figure) from the address 1 thereof until the last address thereof, thereby to write a predetermined logical value (a test pattern signal) in each memory cell. Thereafter, the written logical values are read out therefrom and are compared with an expected value. For example, in case a flash memory to be tested is a NAND type one, the detection of failure memory cell thereof is effected by writing a logical value "0" in all of the memory cells of the flash memory under test, reading out the logical value "0" therefrom, comparing the read-out logical value "0" with an expected value (its logical value is "0"), and determining whether the logical value "0" has been correctly written in each memory cell or not. The NAND type flash memory has its property that it outputs a logical value "1" in the unwritten state in which any data (any logical value) is not written in all of the memory cells thereof. Therefore, a test for a flash memory has to carry out by writing a logical value "0" in all of the memory cells of the flash memory under test. Writing a logical value "0" in and reading out the logical value "0" from each of the memory cells of the flash memory under test are performed on the basis of, for example, 6 bits by 6 bits at the same time.

As discussed above, the prior memory testing apparatus uses the failure analysis memory AFM having its storage capacity equal to or more than that of the memory under test MUT and the same address structure as that of the memory under test MUT, and stores the addresses of the failure memory cells for each of the blocks of the memory under test MUT in the failure analysis memory AFM. After the test has been completed, the testing apparatus supplies an address signal ADR to the failure analysis memory AFM to discriminate each block of the flash memory, and then counts the number of failure memory cells for each block. Thereafter, a decision is rendered whether the repair of the failure memory cells is possible or not within the number of the spare column cell lines SC and the number of the spare blocks SB. Consequently, there is a drawback that the time duration required for carrying out the failure repair analysis becomes considerably long.

Moreover, since the flash memory is a non-volatile memory, there may be a case due to its characteristic in which a failure memory cell or cells that at first data cannot be written therein and cannot be read out therefrom will change to normal memory cell or cells that data can be written therein and can be read out therefrom during a writing operation and a reading operation are being repeated several times for such failure memory cell or cells. For this reason, in the inside of the flash memory are added a function that decides whether writing of data in a memory cell is correctly performed or not as well as a function that unless writing of data in a memory cell is correctly performed, performs rewriting of data in a memory cell. Though the number of rewriting operations is limited to six times or so at the maximum, in case of a failure memory cell that data cannot be written therein, the rewriting operation is repeated until the number of the rewriting operations reaches a preset number of times. When the number of the rewriting operations reaches a preset number of times, the writing of data in the current address is ceased and the writing operation proceeds to the next address. At the same time, the address in which the writing of data could not have been done is stored in the failure analysis memory AFM as a failure address. Accordingly, there is a drawback that the time duration required for carrying out the rewriting operations becomes considerably long. As a result, there is an important defect that the time duration required for testing a flash memory becomes long in proportion to the number of failure memory cells.

In addition, in case a plurality of flash memories are simultaneously tested, even if there exists only one flash memory having its block containing a failure address, the writing operation for this flash memory is repeated a predetermined number of times when the failure address thereof is accessed. As a result, the remaining flash memories must await until the writing operation for the failure address is repetitively carried out predetermined number of times, notwithstanding that the writing operation for each of the remaining flash memories has been completed only once. Accordingly, there is a serious drawback that the remaining flash memories spend a waste of time, which results in longer test time.

In recent years, in order to reduce a testing cost, many semiconductor memory testing apparatus each being able to test and measure a multiplicity of (for example, 64) semiconductor memories at the same time have appeared, and when many flash memories are simultaneously tested by such a semiconductor memory testing apparatus, there is a strong possibility that at least one flash memory among them has its block including a failure address. Accordingly, the aforesaid drawback resulting in longer test time eventually brings about an increase of the testing cost.

SUMMARY OF THE INVENTION

It is an object of the present invention to provide a memory testing method and a memory testing apparatus each being capable of deciding whether a repair of failure in a memory that the stored data can be electrically erased in all bits en bloc or in block by block en bloc and data can be rewritten therein can be performed or not during the test of the memory.

It is another object of the present invention to provide a memory testing method and a memory testing apparatus each being capable of reducing a time duration required for testing a non-volatile memory that the stored data can be electrically erased in all bits en bloc or in block by block en bloc and data can be rewritten therein.

In order to accomplish the above objects, in a first aspect of the present invention, there is provided a memory testing method comprising the steps of: writing a predetermined logical value in memory cells constituting each of blocks of a memory having block function; reading out the written logical value from the memory cells in each block; rendering a decision that, when the written logical value and the read-out logical value do not coincide with each other, such memory cell is a failure memory cell; and discontinuing, when the number of failure memory cells in a block being now tested reaches a predetermined number, the test of such block.

In a preferred embodiment, the aforesaid memory testing method further comprises the step of transferring, at the time point that the test of such block has been discontinued, a block to be tested to the next block.

In addition, the aforesaid memory testing method further comprises the step of rendering a decision that, when the number of failure memory cells in a block being now tested reaches a predetermined number, such block is to be repaired by a spare block, and when such repair decision is rendered, the test of such block is discontinued.

In case a plurality of memories are concurrently tested, when a decision is rendered that a block of a memory being now tested is to be repaired by a spare block, the test of such block of the memory is interrupted, and the test of the next block of the memory is started in synchronism with the transfer of the test of the remaining memory or memories to the next block thereof.

In a second aspect of the present invention, there is provided a memory testing method comprising the steps of: writing a predetermined logical value in memory cells constituting each of blocks of a memory having block function; reading out the written logical value from the memory cells in each block; rendering a decision that, when the written logical value and the read-out logical value do not coincide with each other, such memory cell is a failure memory cell and masking, when the number of failure memory cells on the same address line reaches a predetermined number, the test of memory cells on said address line in other block or blocks to be tested thereafter.

In a preferred embodiment, when the number of blocks each being decided to be repaired by a spare block exceeds a predetermined allowable value, the memory being now tested is ended in test to be conducted thereafter.

In a third aspect of the present invention, there is provided a memory testing apparatus for testing whether or not a predetermined logical value is correctly written in memory cells constituting each of blocks of a memory having block function, and comprising: bad block detection and storage means detecting the presence of a failure memory cell in each block, rendering a decision that, when the number of failure memory cells in each block reaches a predetermined number, such block is a bad block, and storing therein the result of the decision; bad address line detection and storage means detecting the presence of a failure memory cell on the same address line, rendering a decision that, when the number of failure memory cells on the address line reaches a predetermined number, said address line is a bad address line, and storing therein the result of the decision; and mask control means controlling to interrupt, when said bad block detection and storage means has rendered a decision that a block being now tested is a bad block, the test of the block being now tested and to write, when said bad address line detection and storage means has detected a bad address line, a forced writing signal in memory cells on the detected bad address line in the test of other block or blocks to be tested thereafter, thereby to exclude such memory cells from memory cells to be tested.

In a preferred embodiment, the aforesaid memory testing apparatus further comprises: bad memory detecting means rendering a decision that, when it detects that a predetermined number of bad blocks has been stored in said bad block detection and storage means, the memory being tested from which such bad blocks have been generated is a bad memory; and mask control means controlling to stop, after the time point that said bad memory detecting means has rendered a decision that the memory being tested is a bad memory, the test of the memory.

With the memory testing method and apparatus according to the present invention described above, in case that the number of failure memory cells detected in a block being tested at present of the memory under test exceeds, for example, the number of the spare column cell lines, a decision is rendered that such block can be repaired by substituting it for one of the spare blocks. Accordingly, it is unnecessary to carry out the testing of such block after that time point, and hence the testing can transfer to the next block. As a result, a time duration required to test a memory can be reduced. Moreover, after the testing has been completed, there is no need for deciding whether the repair of the failure block is possible or not, which results in further reduction of the testing time.

In addition, in case a plurality of flash memories are tested at the same time, if a decision is rendered that a failure block of a flash memory can be repaired by substituting it for one of the spare blocks, the testing of such block of the flash memory is interrupted at that time point, and when the testing of the remaining flash memory or memories is transferred to the next block thereof, the testing of the flash memory which has been interrupted can be resumed in synchronism with the transfer in the testing of the remaining flash memory or memories to the next block thereof. Accordingly, a drawback can be removed that due to that it takes a long time to test a flash memory having many failure memory cells, the testing time of other flash memory or memories having relatively a small number of failure memory cells is also lengthened.

Moreover, in case the number of failure memory cells on the same address line (column address line) more than a predetermined value (the number of the spare blocks) is detected, a decision is rendered that such column address line on which the failure memory cells exist is to be repaired by one of the spare column cell lines, and in other block or blocks to be subsequently tested, the testing thereof is carried out by excluding memory cells on such column address line from memory cells to be tested. As a result, even if there should exist many failure memory cells on the same column address line, it takes some time until a predetermined value of failure memory cells is counted, but thereafter, memory cells on such bad column address line are excluded from memory cells to be tested. Consequently, the time duration required for carrying out the testing can be reduced.

In addition, in case the number of bad blocks exceeds a predetermined allowable value and the repair of the failure blocks by using the spare blocks becomes impossible, the testing of such flash memory is stopped and is treated as a failure memory. Consequently, a drawback can be also removed that due to that it takes a long time to test a memory having many failure memory cells, the testing time of other memory or memories is also lengthened.

DETAILED DESCRIPTION OF THE PREFERRED EMBODIMENTS

Now, the preferred embodiment of the memory testing apparatus according to the present invention will be described in detail with reference to FIGS. 1 to 3. The present invention may, however, be embodied in many different forms and should not be construed as limited to the embodiment set forth hereinafter; rather, the embodiment is provided so that this disclosure will be thorough and complete, and will fully convey the scope of the invention to those skilled in the art. Further, portions or elements in FIGS. 1 and 3 corresponding to those in FIGS. 5 and 6 will be shown by the same reference characters affixed thereto, and the explanation thereof will be omitted unless it is necessary.

Figure 1:
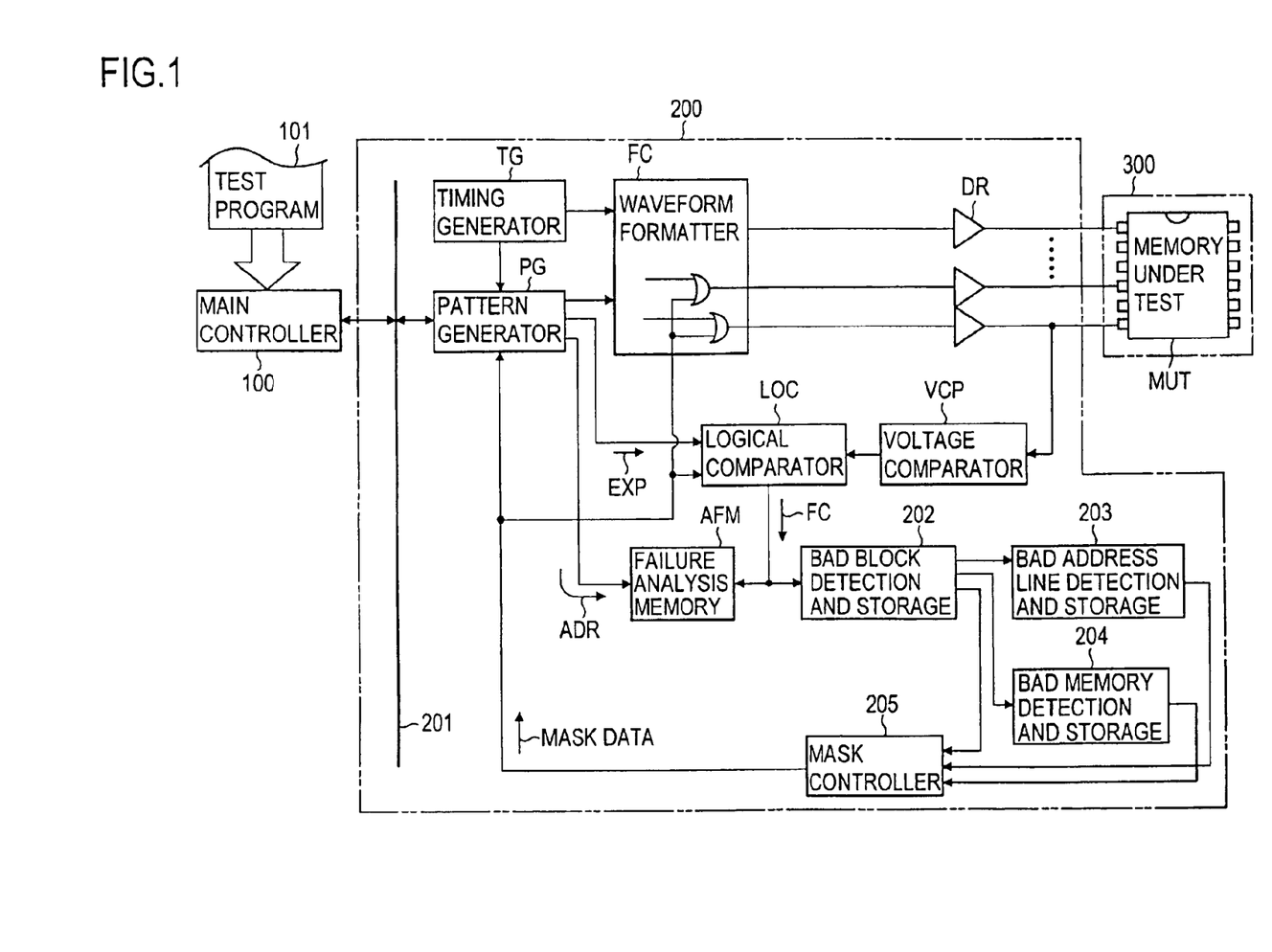
FIG. 1 is a block diagram showing an embodiment of the memory testing apparatus according to the present invention.

FIG. 1 shows, in block diagram form, an embodiment of the memory testing apparatus according to the present invention. Like the prior memory testing apparatus shown in FIG. 5, the memory testing apparatus of this embodiment is also constituted by a main controller 100, a testing apparatus proper (hereinafter, referred to as main frame) 200 called "main frame" in this technical field, and a test head 300. The main frame 200 comprises a timing generator TG, a pattern generator PG, a waveform formatter FC, drivers DR, a voltage comparator VCP, a logical comparator LOC, and a failure analysis memory AFM, like the prior memory testing apparatus.

A memory to be tested (memory under test) MUT is mounted on a device socket of the test head 300, through which a test pattern signal from the main frame 200 is written in the memory under test MUT, and a response signal read out from the memory under test MUT is supplied to the main frame 200, thereby to test and measure the memory under test MUT.

In this embodiment, the main frame 200 further comprises a bad block detection and storage 202, a bad address line detection and storage 203, a bad memory detection and storage 204, and a mask controller 205.

Further, in FIG. 1, only the drivers DR are shown in the plural form, but, in reality, a predetermined number, for example, 512 of the drivers DR are provided. In addition, the pattern generator PG, the waveform formatter FC, the voltage comparator VCP, the logical comparator LOC in the main frame 200 are also provided by the same number (for example, 512) as that of the drivers DR, respectively. It is needless to say that the construction of the main frame 200 is not limited to such construction as mentioned above.

In addition, FIG. 1 illustrates the construction of the memory testing apparatus, in which only one memory under test MUT can be tested. In case of testing a plurality of memories under test MUT, the memory testing apparatus is constructed such that it comprises the pattern generators PG, the waveform formatters FC, the voltage comparators VCP, the drivers DR, the logical comparators LOC, the failure analysis memory AFM, the bad block detection and storage 202, the bad address line detection and storage 203, the bad memory detection and storage 204, and the mask controller 205 provided for each memory under test MUT.

Here, in this specification, as a result of the testing of a flash memory, if a block of the flash memory has defective or failure memory cells equal to or larger than a predetermined number, such block will be referred to as "bad block", and if an address line of the flash memory has defective or failure memory cells equal to or larger than a predetermined number, such address line will be referred to as "bad address line".

To the bad block detection and storage 202 is supplied a anti-coincidence detection signal (failure or bad detection signal) FC outputted from the logical comparator LOC. The bad block detection and storage 202 counts the number of failure detection signals supplied thereto. When the number of failure memory cells detected in a block of the memory under test MUT being tested at present reaches a predetermined number (the sum number of the number of the spare column cell lines SC shown in FIG. 6 and one (1), five (5) in the example of FIG. 6), the bad block detection and storage 202 renders a decision that such block is a bad block, and supplies the result of the decision to the bad address line detection and storage 203, the bad memory detection and storage 204, and the mask controller 205. The detected bad block is to be repaired by one of the spare blocks SB already described with reference to FIG. 6. Accordingly, the mask controller 205 outputs, when it receives the decision result that a bad block has been detected from the bad block detection and storage 202, a mask data thereby to control such that the testing of this bad block is interrupted as described later.

The bad address line detection and storage 203 counts the number of failure memory cells occurring on the same address line (the same column address line in this embodiment). When the number of failure memory cells reaches a predetermined number (the sum number of the number of the spare blocks SB shown in FIG. 6 and one (1), five (5) in the example of FIG. 6), the bad address line detection and storage 203 renders a decision that such address line is a bad address line, and supplies the result of the decision to the mask controller 205. The detected bad address line is to be repaired by one of the spare column cell lines SC already described with reference to FIG. 6. Accordingly, the mask controller 205 outputs, when it receives the decision result from the bad address line detection and storage 203 that a bad address line has been detected, a mask data thereby to control such that the testing of memory cells on such bad address line in other block or blocks to be subsequently tested of the memory under test MUT is not carried out as described later. As a result, even if there should exist a plurality of consecutive failure memory cells on the detected bad address line, after the decision has been rendered that such address line is a bad address line, the testing of memory cells on such bad address line is not carried out, and hence a drawback that it takes a long time to test a flash memory can be removed.

The bad memory detection and storage 204 counts the number of bad blocks each time the bad block detection and storage 202 detects a bad block. When the count value of bad blocks reaches a predetermined allowable value (the sum of the number of the spare blocks SB and several percent (%) of the number of the total blocks), the bad memory detection and storage 204 renders a decision that the memory being now tested is a bad memory, and supplies the result of the decision to the mask controller 205. Since the memory being now tested that is decided to be a bad memory cannot be repaired, the mask controller 205 outputs, when it receives the decision result from the bad memory detection and storage 204 that a bad memory has been detected, a mask data thereby to control such that the memory being now tested is treated as a failure article. Consequently, on and after the time point that the memory being now tested has been determined to be a bad memory, the testing of this memory is ceased.

From the foregoing explanation, the epitome of the construction, function and operation of the principal portion of the embodiment shown in FIG. 1 will be understood. Further, the construction and operation of the principal portion of this embodiment will be described in detail with reference to FIGS. 2 and 3.

Figure 2:
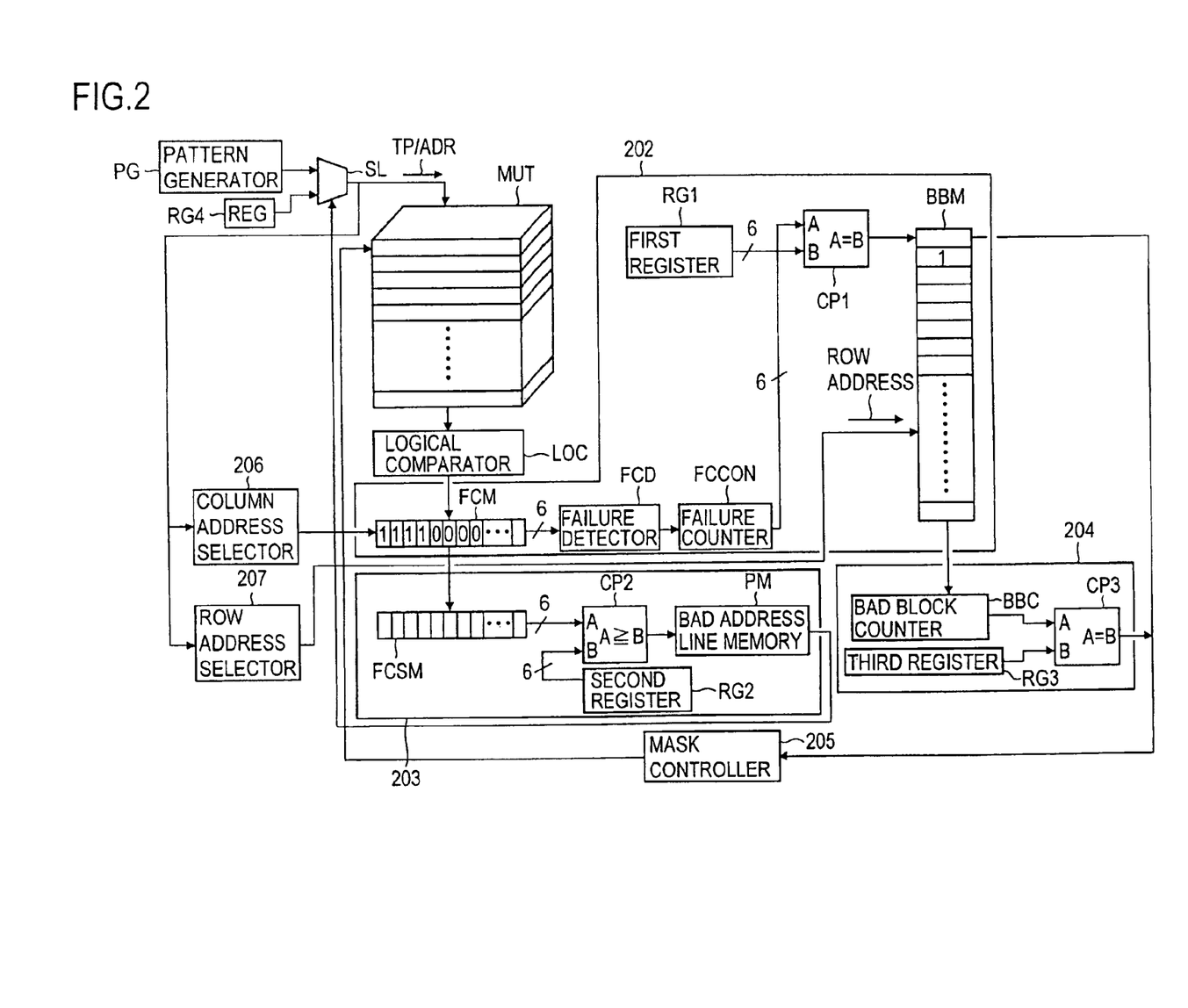
FIG. 2 is a block diagram showing a detailed construction of the principal portion of the memory testing apparatus shown in FIG. 1.

FIG. 2 shows, in block diagram form, a detailed construction of the principal portion of the embodiment of the memory testing apparatus shown in FIG. 1. The bad block detection and storage 202 may comprise a register FCM having its bit length equal to that of the column addresses of the memory under test MUT, a failure detector FCD for detecting a failure detection signal read out of the register FCM, a failure counter FCCON for counting the number of failure detection signals each time the failure detector FCD detects a failure detection signal, a first register RG1 in which a predetermined value (the sum of the number of the spare column cell lines SC and one (1), for example) is set, a first comparator CP1 for comparing the predetermined value previously set in the first register RG1 with the count value (the number of the failure detection signals) of the failure counter FCCON, and a bad block memory BBM for storing a data, for example, logical value "1" representing a bad block in the same address thereof as that of the block being tested of the memory under test MUT when the first comparator CP1 outputs a detection signal representing that the count value of the failure counter FCCON has been equal to the predetermined value set in the first register RG1.

To the memory under test MUT are supplied a test pattern signal TP and an address signal ADR from the pattern generator PG, and if the memory under test MUT is NAND type flash memory, logical value "0" is written in all of the memory cells in the block to be tested. Each of the blocks of the memory under test MUT is selected by a row address, and the selected block is accessed one address by one address in the column address direction and the written logical value in each memory cell is read out. That is, in the memory under test MUT, logical value written in each of the memory cells on each row address line is sequentially read out in the column address direction.

Figure 3:
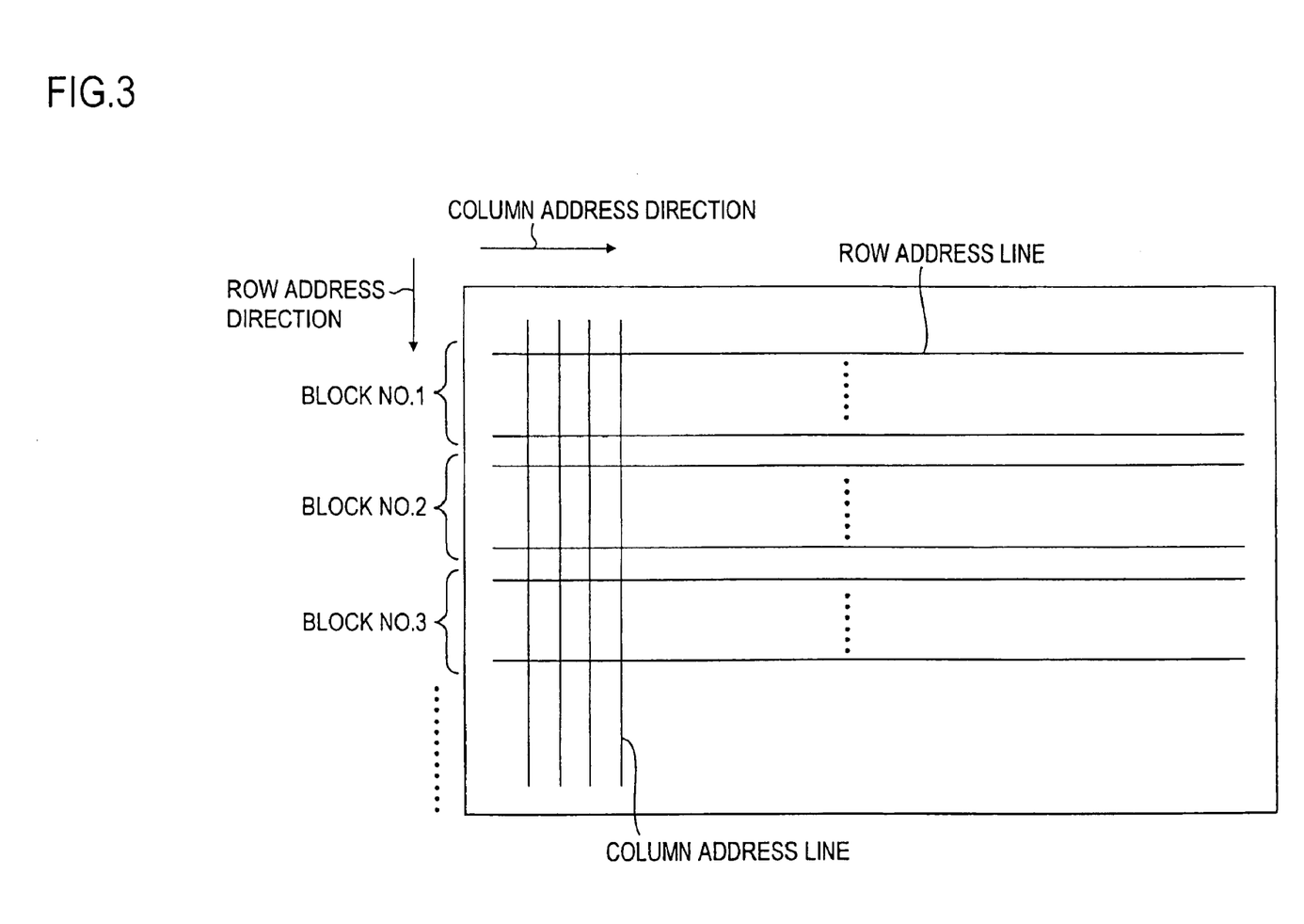
FIG. 3 is a structural diagram for explaining an example of the arrangement of row address lines and column address lines of a memory under test tested by the memory testing apparatus according to the present invention.

FIG. 3 is a structural diagram for explaining an example of the arrangement of row address lines and column address lines of a memory under test. Each of the row address lines ROLIN is an address line in the left and right direction on the figure and is accessed by a row address. Each of the column address lines COLIN is an address line in the up-and-down direction on the figure and is accessed by a column address. The direction of each row address line ROLIN is the same as the column address direction, and the direction of each column address line is the same as the row address direction.

An address signal ADR supplied to the memory under test MUT from the pattern generator PG is also supplied to a column address selector 206. The column address selector 206 extracts a column address signal from the supplied address signal and supplies it to the register FCM. The register FCM stores data corresponding to the comparison result outputted from the logical comparator LOC in an address thereof accessed by the column address signal supplied thereto. As already described, the logical comparator LOC outputs, when a response signal read out of the memory under test MUT does not coincide with an expected value signal EXP supplied from the pattern generator PG, a failure detection signal FC representing a failure (badness) of that memory cell. Since a failure data (logical value "1") is written in the specified address (corresponding to the column address of the memory under test MUT) of the register FCM by the output of such failure detection signal FC, it will be known that the memory cell at the column address of the memory under test MUT corresponding to the specified address in which the failure data has been written is defective (failure one). Further, only one register FCM is shown in FIG. 2, but in reality, a plurality of, for example, six or so registers are provided and six memory cell lines on the six row address lines will be tested at a time.

When the last address of the register FCM is accessed by the last column address signal and the comparison result of the last column address of the memory under test MUT is taken in the last address of the register FCM, failure data taken in the register FCM at that time are transferred to a stock register FCSM in the correspondence of bits of the register FCM and the stock register FCSM, the stock register FCSM being one component of the bad address line detection and storage 203. At the same time, the stored data at each of the addresses of the register FCM is read out and supplied to the failure detector FCD. Each time the register FCM outputs logical "1" which is a failure data, the failure detector FCD inputs the logical "1" into the failure counter FCCON which in turn counts the number of failures.

The count value being counted by the failure counter FCCON is compared with a numerical value previously set in the first register RG1 in the first comparator CP1. As described above, in the first register RG1 is set the sum value of the number of the spare column cell lines SC and one (1). Therefore, if the number of the spare column cell lines SC is four (4) as shown in FIG. 6, the numerical value "5" is previously set in the first register RG1.

When the count value of the failure counter FCCON reaches "5", the first comparator CP1 outputs data, for example, logical "1" representing that the block being now tested is a bad block to supply it to the bad block memory BBM which in turn stores the logical "1" therein. A row address signal which is the same as that supplied to the memory under test MUT is also supplied to the bad block memory BBM from the row address selector 207 and the same block of the bad block memory BBM as the block of the memory under test MUT is accessed by that row address signal. Accordingly, since the bad block memory BBM is accessed in the same address thereof as that of the block being now tested of the memory under test MUT, the logical value "1" is written in the same address of the bad block memory BBM as that of the block determined to be a bad block, and hence the bad block memory BBM can store a bad block.

When the logical value "1" representing a bad block is written in the bad block memory BBM, such information is transmitted to the mask controller 205. In response to the information, the mask controller 205 supplies a mask data to the pattern generator PG, the logical comparator LOC, and the like thereby to mask the block being tested at that time (to end the testing of that block, for example, by inhibiting a write enable signal from being applied to the memory under test MUT, inhibiting the logical decision in the logical comparator LOC, and the like).

In case the memory under test MUT is only one, the testing proceeds to the next block of the memory under test MUT. On the contrary, in case many memories are concurrently tested, only one or more memories that a bad block has been detected are interrupted in the testing of such bad block. During the time duration that the testing of such bad block is suspending, however, the testing of the remaining memories are continued.

After the stored data at each of the addresses of the register FCM has been read out, the stored contents of the register FCM are reset. In case the logical value "1" representing a bad block is not written in the bad block memory BBM, the stored content in each of the memory cells on the row address line ROLIN accessed by the next address signal in the same block of the memory under test MUT is read out and compared in the logical comparator LOC to decide whether it is a failure data or not.

When the stored content in each of the memory cells on all of the row address lines in the same block is read out without any decision that the block being tested is a bad block and all data each representing the decision result of failure or pass are taken in the register FCM, the testing proceeds to the next block.

Here, the bad address line detection and storage 203 may comprise the aforesaid stock register FCSM, a second register RG2 in which a predetermined numerical value is set, a second comparator CP2 for comparing the output data from the second register RG2 with the output data from the stock register FCSM, and a bad address line memory PM for storing a bad address line therein.

The stock register FCSM accumulates the number of failure memory cells on each of the column address lines COLIN and stocks it therein. Each time the accumulation of the number of failure memory cells on each of the column address lines COLIN is completed, the stock value in the stock register FCSM is read out therefrom and supplied to the second comparator CP2. Accordingly, each time the number of failure memory cells on each of the column address lines COLIN has been accumulated, the accumulated value is supplied from the stock register FCSM to the second comparator CP2.

The second comparator CP2 compares the numerical value previously set in the second register RG2, for example, the sum value of the number of the spare blocks SB and one (1) (in this example, since the number of the spare blocks SB is supposed to be four, the numerical value is "5") with the accumulated value of failure memory cells on each of the column address lines. When the accumulated value of failure memory cells on each of the column address lines COLIN reaches the numerical value "5" set in the second register RG2, the second comparator CP2 decides that such column address line is a bad address line, and supplies information representing such fact to the bad address line memory PM. This information representing a bad address line (hereinafter, referred to as bad address line information) is stored in the bad address line memory PM. With the bad address line information stored in the bad address line memory PM, that column address line is recognized to be repaired in its failure by one of the spare column cell lines SC.

The bad address line memory PM stores the bad address line information therein as a column address in this embodiment, and controls a selector SL such that an output signal of a fourth register RG4 is applied to the memory under test MUT each time the same column address as that of the column address line determined to be a bad address line is supplied to the memory under test MUT after the storage of the bad address line information. The fourth register RG4 has data to be forcedly written (forced writing data or signal) in the column address of the bad address line previously set therein. As a result, each time the column address of the bad address line is supplied to the memory under test MUT, the forced writing signal stored in the fourth register RG4 is written in the memory cells on the bad address line.

In NAND type flash memory, the "forced writing signal" corresponds to a writing signal of logical value "1". By writing logical "1" in the memory cells thereof, a decision is rendered in the inside of the flash memory that the writing has been correctly effected even if any memory cell or cells should be failure ones. As a result, the next operation will be carried out without any rewriting operation is repeated. Accordingly, even if a memory cell on the bad address line in a block to be tested hereafter should be failure one, logical "1" will be written therein, which is deemed that the writing has been completed, and hence the read operation for the failure memory cell will be performed at once without rewriting in the failure memory cell every time. Consequently, since there occurs no interruption of the testing due to the rewriting, the testing time can be reduced.

The bad memory detection and storage 204 may comprise a bad block counter BBC for counting the number of bad blocks stored in the bad block memory BBM, a third register RG3 in which a predetermined numerical value is set, and a third comparator CP3 for comparing an output data from the third register RG3 with an output data from the bad block counter BBC.

In the third register RG3 is set a numerical value which is equal to the sum of the number of the spare blocks SB and several percent (%) of the total number of the blocks formed in the first and second memory forming sections A1 and A2 (see FIG. 6) of the memory under test MUT. Assuming that the number of the spare blocks SB is "4", the total number of the blocks formed in the first and second memory forming sections A1 and A2 is "512", and 2% of "512" is added to the number of the spare blocks SB, then a numerical value "4+10=14" is previously set in the third register RG3.

If the number of bad blocks is "4", these four bad blocks can be repaired by the spare blocks SB. Moreover, there may be a bad block or blocks which can be repaired by the spare column cell lines SC. Accordingly, it is possible to repair eight bad blocks at the maximum. On the other hand, even if there may exist a bad block which cannot be repaired, there may be adopted a usage in which the flash memory is used by masking its bad block. Therefore, the allowable value set in the third register RG3 is not always in accord with the repairable numerical value for the bad blocks.

When the bad block counter BBC counts the number of bad blocks beyond the allowable value, the third comparator CP3 renders a decision that the memory being now tested is a bad memory, and outputs a mask control signal representing such result of the decision to supply it to the mask controller 205. The mask controller 205 supplies, when it receives the mask control signal, a mask data to the pattern generator PG, the logical comparator LOC, and the like thereby to stop the testing of that bad memory. Accordingly, in case of the memory testing apparatus which tests only one memory, the testing is stopped at that time, and hence there occurs no case that the testing for the bad memory lasts for a long time. On the contrary, in case of the memory testing apparatus which tests a plurality of memories at the same time, the testing of the remaining memories under test are continued. As a result, a drawback can be removed that due to the fact that there exists a memory having many failure memory cells among them, the testing time becomes remarkably long.

Further, in the embodiment described above, it is supposed that the number of the spare column cell lines is "4", the number of the spare blocks is "4", and the total number of the blocks formed in the first and second memory forming sections is "512", they are mere examples and may be changed as occasion arises. In addition, though the sum of the number of the spare blocks and 2% of the number of blocks formed in the first and second memory forming sections is set in the third register RG3, the percentage of the number of blocks is not limited to 2%. Further, the present invention can also be applied to a memory testing apparatus and method for testing a flash memory other than NAND type one.

As is apparent from the foregoing description, in accordance with the present invention, since a decision regarding a failure repair of a memory is rendered during the testing of the memory, there is no need for analyzing a failure repair procedure after the testing of the memory has been completed. Moreover, for a memory under test having many failure memory cells, a testing method is adopted in which after the time point that a block being tested has been determined to be a bad block or an address line has been determined to be a bad address line, memory cells in the bad block or on the bad address line are substantially not tested. Accordingly, the number of the rewriting operations conducted every time a failure memory cell is detected can be largely decreased. As a result, a remarkable advantage is obtained that a time duration required for carrying out the testing can be greatly reduced.

While the present invention has been described with regard to the preferred embodiment shown by way of example, it will be apparent to those skilled in the art that various modifications, alterations, changes, and/or minor improvements of the embodiment described above can be made without departing from the spirit and the scope of the present invention. Accordingly, it should be understood that the present invention is not limited to the illustrated embodiment, and is intended to encompass all such modifications, alterations, changes, and/or minor improvements falling within the scope of the invention defined by the appended claims.

What is claimed is:

1. A memory testing method comprising the steps of:
   writing a predetermined logical value in memory cells constituting each of blocks of a memory having a block function by which memory cells in a block are erased en bloc and made rewritable;
   reading out the written logical value from the memory cells in each block;
   rendering a decision that, when the written logical value and the read-out logical value do not coincide with each other, such memory cell is a failure memory cell; and
   discontinuing the test of such block when the number of failure memory cells in a block being now tested reaches a predetermined number indicating repair of the memory is impossible by substitution of spare memory components.

2. The method as set forth in claim 1, further comprising the step of transferring, at the time point that the test of such block has been discontinued, a block to be tested to the next block.

3. The method as set forth in claim 1, further comprising the step of rendering a decision that, when the number of failure memory cells in a block being now tested reaches the predetermined number, such block is to be repaired by a spare block, and wherein when such repair decision is rendered, the test of such block is discontinued.

4. The method as set forth in claim 1, wherein in case a plurality of memories are concurrently tested, when a decision is rendered that a block of a memory being now tested is to be repaired by a spare block, the test of such block of the memory is interrupted, and the test of the next block of the memory is started in synchronism with the transfer of the test of the remaining memory or memories to the next block thereof.

5. A memory testing method comprising the steps of:
   writing a predetermined logical value in memory cells constituting each of blocks of a memory having a block function by which memory cells in a block are erased en bloc and made rewritable;
   reading out the written logical value from the memory cells in each block;
   rendering a decision that, when the written logical value and the read-out logical value do not coincide with each other, such memory cell is a failure memory cell; and
   masking the test of memory cells on said address line in other block or blocks to be tested thereafter when the number of failure memory cells on the same address line reaches a predetermined number, indicating repair of the memory is impossible by substitution of spare memory components.

6. The memory testing method as set forth in any one of claims 1 to 5, wherein when the number of blocks each being decided to be repaired by a spare block exceeds a predetermined allowable value, the memory being now tested is ended in test to be conducted thereafter.

7. The method as set forth in claim 5, further comprising the steps of:
   rendering a decision that, when a number of failure memory cells on an address line of a block being tested reaches a predetermined number, such block is to be repaired by one of a spare address line; and
   after such repair decision has been rendered, masking the test of memory cells on said address line in testing other block or blocks to be tested thereafter.

8. A memory testing apparatus for testing whether or not a predetermined logical value is correctly written in memory cells constituting each of blocks of a memory having block function, said memory testing apparatus comprising:
   bad block detection and storage means detecting the presence of a failure memory cell in each block, rendering a decision that, when the number of failure memory cells in each block reaches a predetermined number, such block is a bad block, and storing therein the result of the decision;
   bad address line detection and storage means detecting the presence of a failure memory cell on the same address line, rendering a decision that, when the number of failure memory cells on the address line reaches a predetermined number, said address line is a bad address line, and storing therein the result of the decision; and
   mask control means controlling to interrupt, when said bad block detection and storage means has rendered a decision that a block being now tested is a bad block, the test of the block being now tested and to write, when said bad address line detection and storage means has detected a bad address line, a forced writing signal in memory cells on the detected bad address line in the test of other block or blocks to be tested thereafter, thereby to exclude such memory cells from memory cells to be tested.

9. The memory testing apparatus as set forth in claim 8, further comprising:
   bad memory detecting means rendering a decision that, when it detects that a predetermined number of bad blocks has been stored in said bad block detection and storage means, the memory being tested from which such bad blocks have been generated is a bad memory; and
   mask control means controlling to stop, after the time point that said bad memory detecting means has rendered a decision that the memory being tested is a bad memory, the test of the memory.

* * * * *